United States Patent [19]

Tatuta

[11] Patent Number: 5,637,918
[45] Date of Patent: Jun. 10, 1997

[54] SEMICONDUCTOR STACK

[75] Inventor: Toshiki Tatuta, Tokyo, Japan

[73] Assignee: Kabushiki Kaisha Toshiba, Kanagawa-ken, Japan

[21] Appl. No.: 334,119

[22] Filed: Nov. 4, 1994

[30] Foreign Application Priority Data

Nov. 5, 1993 [JP] Japan ................................. 5-276894

[51] Int. Cl.$^6$ ........................ H01L 23/02; H01L 23/48; H01L 23/053
[52] U.S. Cl. ........................ 257/686; 257/685; 257/690; 257/700
[58] Field of Search .............................. 257/685, 686, 257/690, 700

[56] References Cited

U.S. PATENT DOCUMENTS

| | | | |
|---|---|---|---|
| 5,300,811 | 4/1994 | Suzuki et al. | 257/700 |
| 5,426,566 | 6/1995 | Beilstein, Jr. et al. | 257/686 |
| 5,432,729 | 7/1995 | Carson et al. | 257/686 |

FOREIGN PATENT DOCUMENTS 5-55793  7/1993  Japan .

*Primary Examiner*—Mahshid D. Saadat
*Assistant Examiner*—Valencia M. Wallace
*Attorney, Agent, or Firm*—Finnegan, Henderson, Farabow, Garrett & Dunner, L.L.P.

[57] ABSTRACT

A semiconductor stack including a base member and a semiconductor assembly member provided on the base member. The semiconductor assembly member includes a switching element having a first, a second and a third terminal, mounted on a surface of the base member such that the first, second and third terminals of the switching element are led to a same plane, and a batch laminated conductor positioned on the first, second and third terminals of the switching element, composed of superimposition of a first, a second and a third conductor and insulators for insulating between adjacent two of the conductors. The semiconductor assembly member also includes a first, a second and a third connecting device for connecting the first, second and third conductors and the first, second and third terminals of the switching element, respectively. The first, second and third connecting devices thrust through the batch laminated conductor in a state in which the first, second and third connecting devices are electrically connected to the first, second and third conductors and are insulated from the second and third conductors, the first and third conductors and the first and second conductors, respectively.

12 Claims, 11 Drawing Sheets

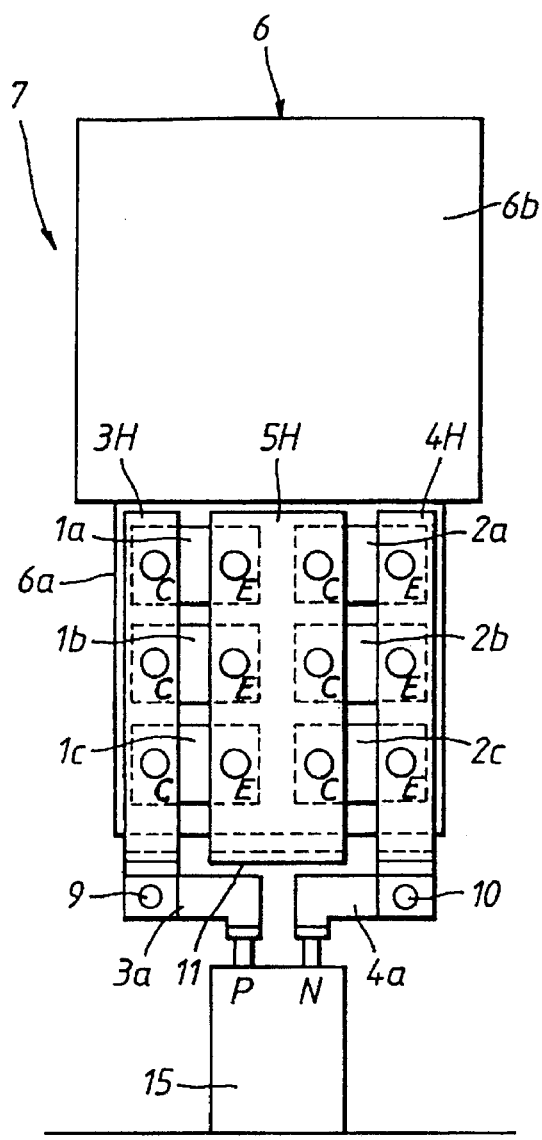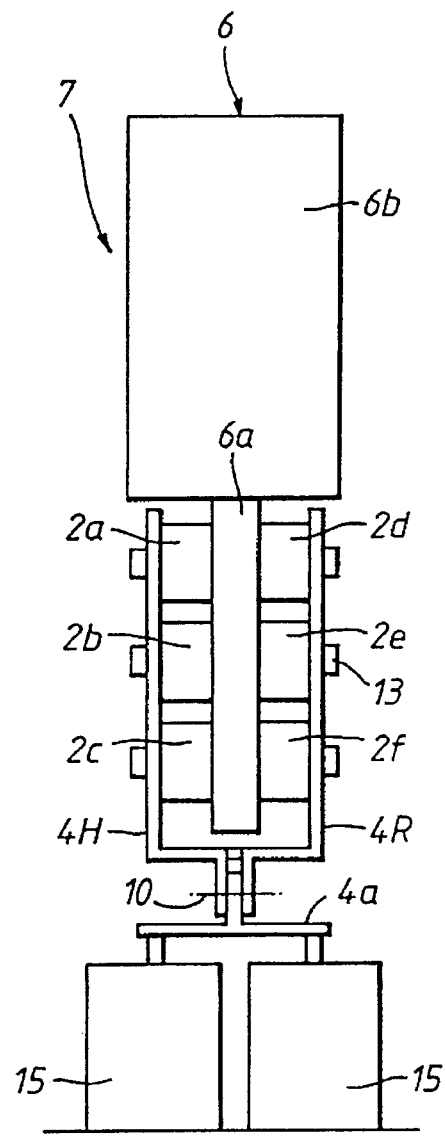
Fig.11(a)
(PRIOR ART)
Fig.11(b)
(PRIOR ART)

SEMICONDUCTOR STACK

BACKGROUND OF THE INVENTION

1. Field of the Invention

This invention relates to a semiconductor stack and more particularly relates to a semiconductor stack composed of a positive switching device and a negative switching device in which two terminals of the positive side and the negative side thereof are led to the same surface.

2. Description of the Related Art

Currently, the high-frequency pulse width modulation (PWM) control method which uses high-speed switching devices is being widely used in power converters. As the capacity of the power converter is made larger, large capacity high-speed switching devices are being used in parallel. Also, in the high-frequency PWM control method, in order to suppress surge voltage generated during switching by reducing the reactance between high-speed switching devices, the high-speed switching devices are installed close to each other and their distance from the capacitor is shorter.

A prior art semiconductor stack is described below with reference to FIGS. 10, 11(a), and 11(b).

FIG. 10 shows a circuit construction of a semiconductor stack 7 composed of the two arms of the positive side and negative side of a given AC phase in a three-phase or single phase bridge circuit. In this circuit, 6 parallel semiconductor switching devices 1a, 1b, 1c, 1d, 1e, 1f and 6 parallel semiconductor switching devices 2a, 2b, 2c, 2d, 2e, 2f, each composed of a transistor, are connected in series between DC terminals 9 and 10. Also in this circuit, two capacitors 15 are connected between DC terminals 9 and 10. Devices 1a–1c are connected in parallel between a DC conductor 3H and an AC conductor 5H. Devices 1d–1f are connected in parallel between a DC conductor 3R and an AC conductor 5R. Devices 2a–2c are connected in parallel between AC conductor 5H, and a DC conductor 4H. Devices 2d–2f are connected in parallel between AC conductor 5R and a DC conductor 4R. An AC terminal 11 is led from AC conductors 5H, 5R. The connection between capacitors 15 and DC terminals 9 and 10 is carried out by DC conductors 3a and 4a, respectively.

FIGS. 11(a) and 11(b) show the packaging of prior art semiconductor stack 7 shown in FIG. 10. FIG. 11(a) is a plan and FIG. 11(b) is a right side elevation.

In FIG. 11(a) and 11(b), devices 1a–1f and 2a–2f are arranged, six to each face, on the two faces of a heat receiving unit 6a of a heat sink 6 with a built-in heat pipe. Devices 1a and 2a, devices 1b and 2b, and devices 1c and 2c are arranged in sequence on the front surface of heat receiving unit 6a of heat sink 6 from a heat radiation unit 6b side. Positive terminals C of devices 1a, 1b and 1c are each connected to DC conductor 3H which is extended from near heat radiation unit 6b of heat sink 6. DG conductor 3H is connected to DC conductor 3a through DC terminal 9. Negative terminals E of devices 1a, 1b and 1c and positive terminals C of devices 2a, 2b and 2c are each connected to AC conductor 5H which is extended from near heat radiation unit 6b. The end of AC conductor 5H forms AC terminal 11. Negative terminals E of devices 2a, 2b and 2c are each connected to DC conductor 4H which is extended from near heat radiation unit 6b. DC conductor 4H is connected to DC conductor 4a through DC terminal 10. The other ends of DC conductor 3a and DC conductor 4a are respectively connected to the positive terminals and the negative terminals of capacitors 15.

Also, devices 1d and 2d, devices 1e and 2e, and devices 1f and 2f are arranged in sequence from heat radiation unit 6b side on the rear surface of heat receiver 6a of heat sink 6 in the same way as for the front surface. Positive terminals C and negative terminals E of these devices are connected to one of two DC conductors 3R and 4R and AC conductor 5R in the same way as for the front surface. As shown in FIG. 11(a), AC terminal 11 is arranged in a position close to and equidistant from DC terminals 9 and 10. Also, each of conductors 3H, 3R, 4H, 4R, 5H and 5R is formed in a belt shape, as shown in FIG. 11(a) and 11(b).

In FIG. 11(b), only DC conductors 4H and 4R and DC conductor 4a are shown. A DC conductor is composed by DC conductors 3H and 3R; a DC conductor is composed by DC conductors 4H and 4R; and an AC conductor is composed by AC conductors 5H and 5R.

As shown in FIG. 11(b), each of the DC conductors 3H, 4H, 3R and 4R and AC conductors 5H and 5R positioned on the front and rear faces of heat receiving unit 6a is respectively bent toward the end surface of heat receiving unit 6a at the front of heat receiving unit 6a. DC terminals 9 and 10 and AC terminal 11 are arranged at intermediate positions of DC conductors 3H and 3R, DC conductors 4H and 4R, and AC conductors 5H and 5R, respectively.

However, in this type of composition in which AC conductors and DC conductors are arranged three-dimensionally by making them belt-shaped and dividing them, there is a limit to making the wiring reactance of the circuit smaller and to suppressing surge voltages during the switching action of each device.

There is also an imbalance between currents flowing through each of devices connected in parallel caused by the difference between the distances from each of the devices to DC or AC terminal.

SUMMARY OF THE INVENTION

Accordingly, one object of this invention is to provide a semiconductor stack which can make the circuit reactance smaller and can further suppress voltages during the switching action of each device.

Another object of this invention is to provide a semiconductor stack which can improve the balance of currents flowing through each of devices connected in parallel.

These and other objects of this invention can be achieved by providing a semiconductor stack including a base member and a semiconductor assembly member provided on the base member. The semiconductor assembly member includes a switching element having a first, a second and a third terminal, mounted on a surface of the base member such that the first, second and third terminals of the switching element are led to a same plane, and a batch laminated conductor positioned on the first, second and third terminals of the switching element, composed of superimposition of a first, a second and a third conductor and insulators for insulating between adjacent two of the conductors. The semiconductor assembly member also includes a first, a second and a third connecting device for connecting the first, second and third conductors and the first, second and third terminals of the switching element, respectively. The first, second and third connecting devices thrust through the batch laminated conductor in a state in which the first, second and third connecting devices are electrically connected to the first, second and third conductors and are insulated from the second and third conductors, the first and third conductors and the first and second conductors, respectively.

According to one aspect of this invention, there is provided a semiconductor stack including a base member, a first semiconductor assembly member provided on a first surface of the base member and a second semiconductor assembly member provided on a second surface of the base member. Each of the first and second semiconductor assembly members includes a switching element having a first, a second and a third terminal, mounted on one of the first and second surfaces of the base member such that the first, second and third terminals of the switching element are led to a same plane, and a batch laminated conductor positioned on the first, second and third terminals of the switching element, composed of superimposition of a first, a second and a third conductor and insulators for insulating between adjacent two of the conductors. The batch laminated conductor includes a first, a second and a third connection portion electrically connected to the first, second and third conductors, respectively. Each of the first and second semiconductor assembly members also includes a first, a second and a third connecting device for connecting the first, second and third conductors and the first, second and third terminals of the switching element, respectively. The first, second and third connecting devices thrust through the batch laminated conductor in a state in which the first, second and third connecting devices are electrically connected to the first, second and third conductors and are insulated from the second and third conductors, the first and third conductors and the first and second conductors, respectively. Each of the first and second semiconductor assembly members further includes a first, a second and a third conductor connecting device for connecting the first, second and third connection portions of the first and second semiconductor assembly members, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 11(a) and 11(b) are respective front and side elevational views showing a prior art semiconductor stack.

DETAILED DESCRIPTION OF THE PREFERRED EMBODIMENTS

Figure 1A:
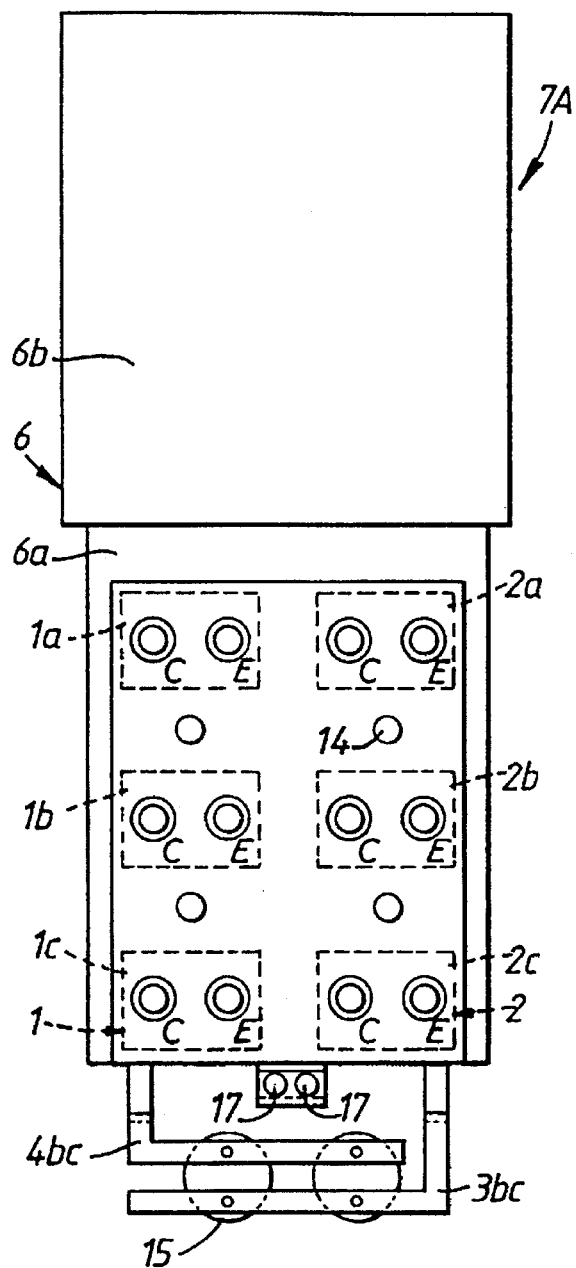
FIGS. 1(a) and 1(b) are respectively front and side elevations showing a semiconductor stack according to an embodiment of this invention.

Referring now to the drawings, wherein like reference numerals designate identical or corresponding parts throughout the several views, the embodiments of this invention will be described below.

The following is a description of an embodiment of this invention with reference to FIGS. 1–9. FIG. 1(a) is a plan showing the packaged state of the front surface of a semiconductor stack 7A according to an embodiment of this invention, and FIG. 1(b) is its right side elevation. The packaged circuit is identical to that shown in FIG. 10 except connecting conductors.

Figure 1B:
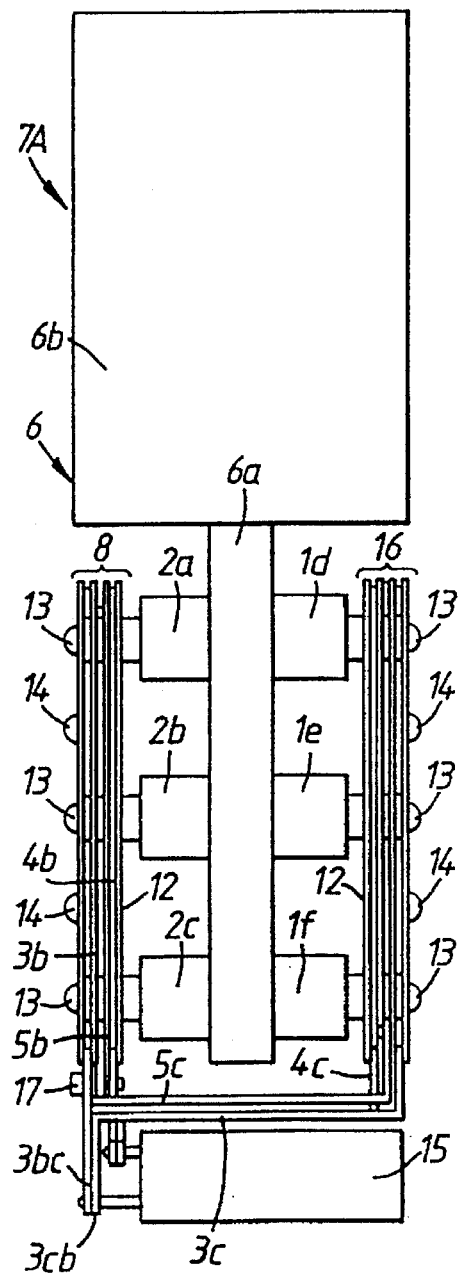

As shown in FIGS. 1(a) and 1(b), devices 1a–1c and 2a–2c are arranged on heat receiving unit 6a of heat sink 6 on the front side of semiconductor stack 7A in the same way as in FIGS. 11(a) and 11(b). A batch laminated conductor 8 is arranged on terminals C and E of devices 1a–1c and 2a–2c so that it covers each terminal. Similarly devices 1d–1f and 2d–2f are arranged on heat receiving unit 6a of heat sink 6 on the rear side of semiconductor stack 7A. A batch laminated conductor 16 is arranged on terminals C and E of devices 1d–1f and 2d–2f so that it covers each terminal. Each conductor of batch laminated conductor 16 is bent toward the front surface of heat receiving unit 6a at the front of heat receiving unit 6a, and it joined to each corresponding conductor of batch laminated conductor 8 on the front surface, as described later in detail.

Figure 2:
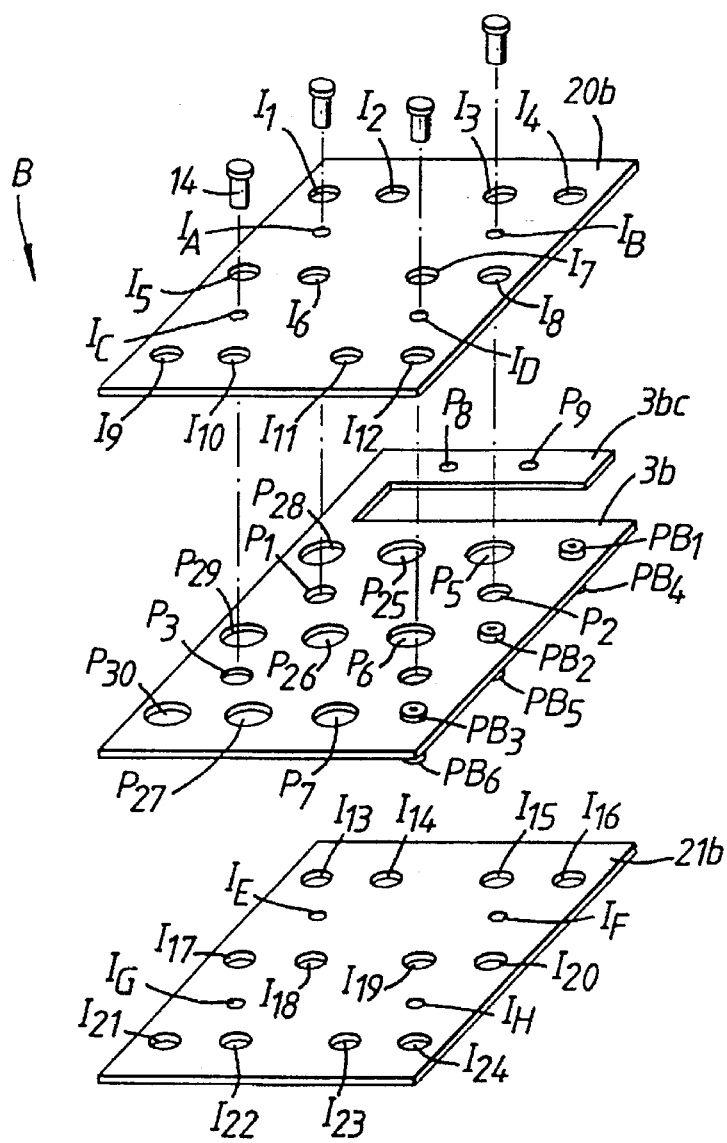
FIG. 2 is an exploded oblique view showing part of the batch laminated conductor on the front surface of the embodiment shown in FIGS. 1(a) and 1(b)
Figure 2:
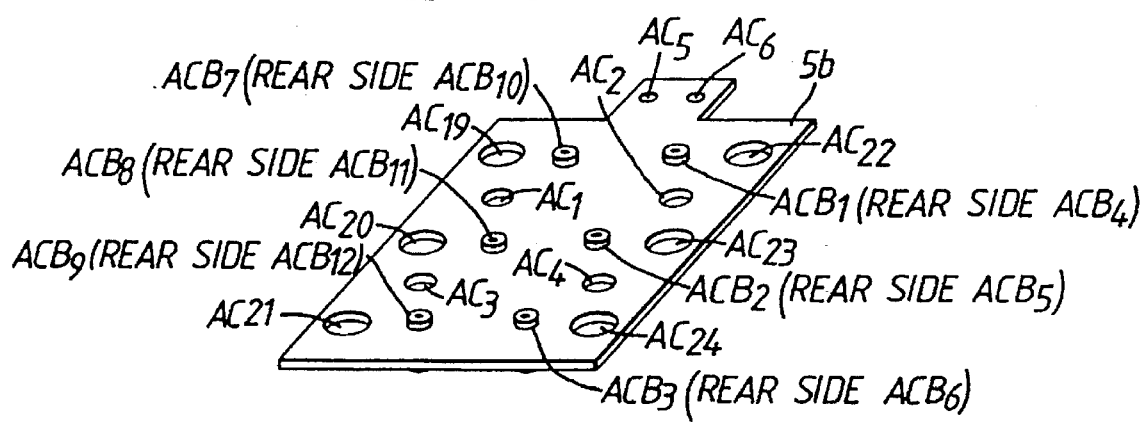
Figure 3:
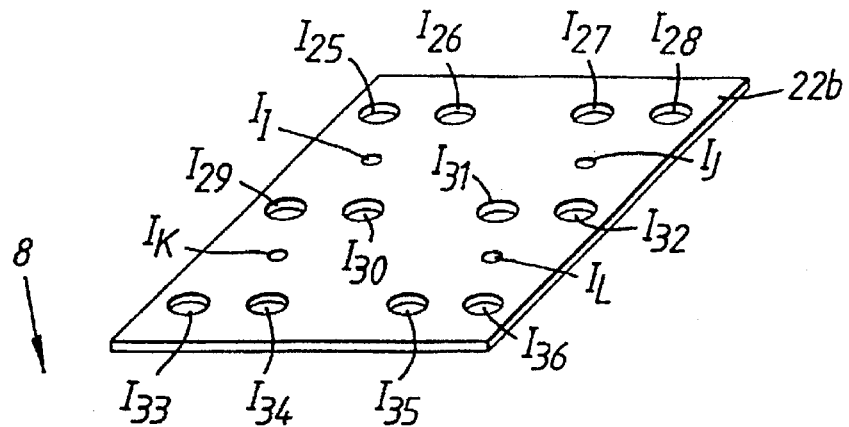
FIG. 3 is an exploded oblique view showing another part of the batch laminated conductor on the front surface of the embodiment shown in FIGS. 1(a) and 1(b)
Figure 3:
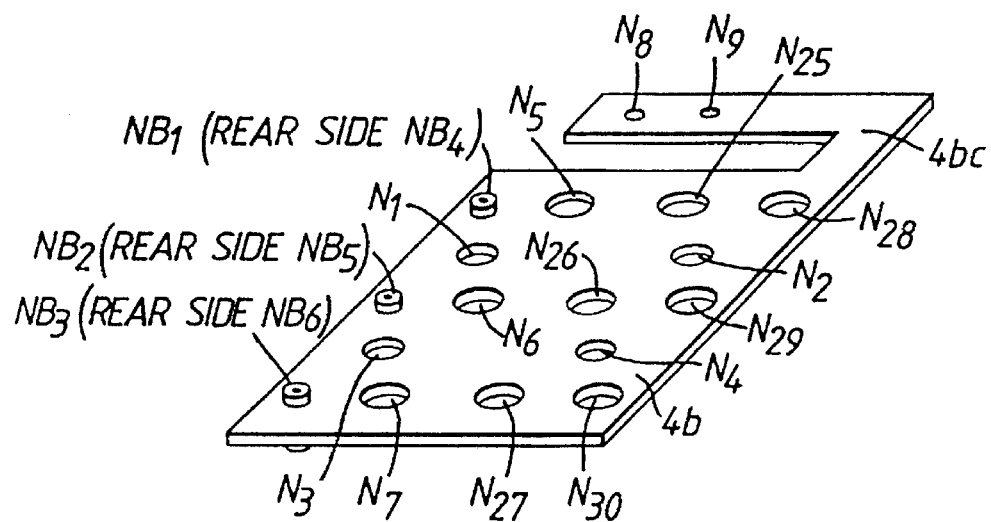
Figure 3:
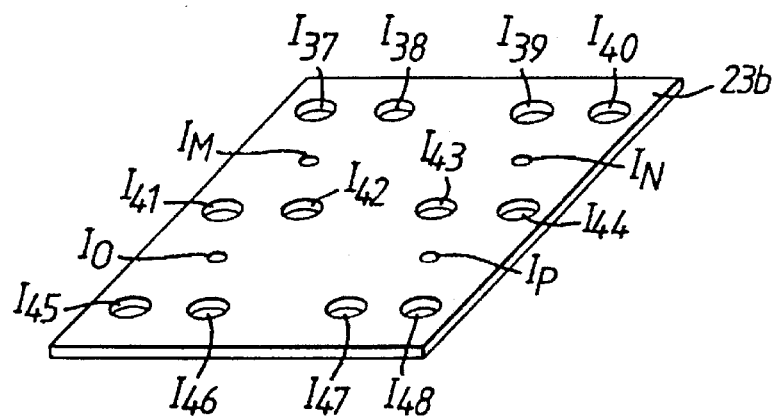

FIGS. 2 and 3 are parts of an exploded oblique view of batch laminated conductor 8, respectively, and the two parts together form batch laminated conductor 8. Batch laminated conductor 8 shown in FIGS. 2 and 3 is positioned on the front side of heat receiving unit 6a as described above, and is composed by the superimposition of a DC conductor 3b, a DC conductor 4b, an AC conductor 5b between them, and four insulating plates 20b, 21b, 22b and 23b which sandwich each of these conductors 3b, 4b and 5b. These are laminated in the sequence from the side which is in contact with each of terminals C and E of devices 1a–1c and 2a–2c of: insulating plate 23b, DC conductor 4b, insulating plate 22b, AC conductor 5b, insulating plate 21b, DC conductor 3b, insulating plate 20b.

Figure 4:
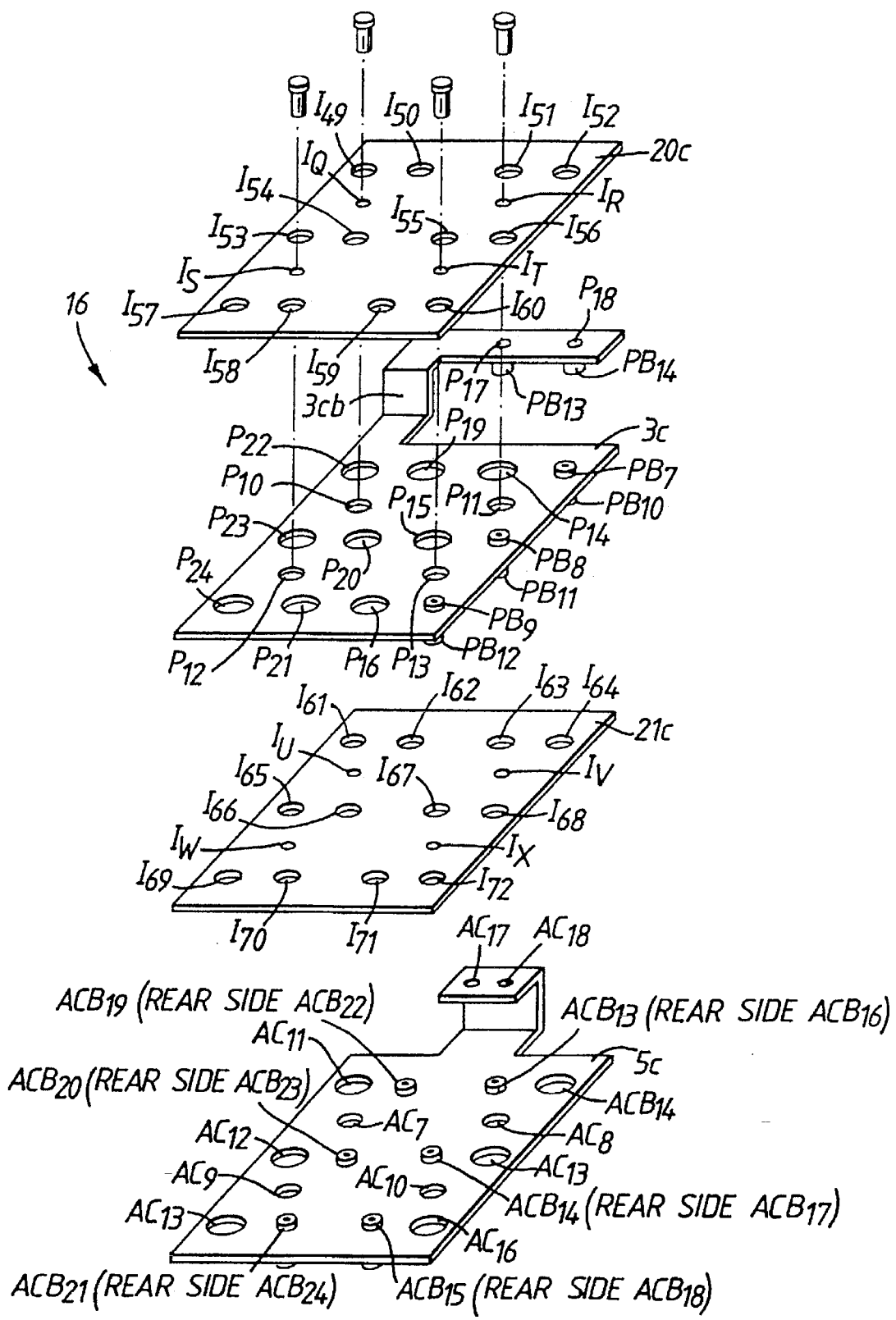
FIG. 4 is an exploded oblique view showing part of the batch laminated conductor on the rear surface of the embodiment shown in FIGS. 1(a) and 1(b)
Figure 5:
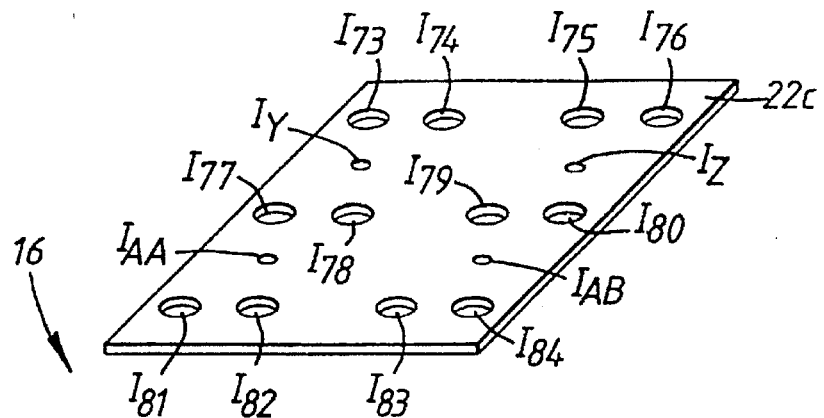
FIG. 5 is an exploded oblique view showing another part of the batch laminated conductor on the rear surface of the embodiment shown in FIGS. 1(a) and 1(b)
Figure 5:
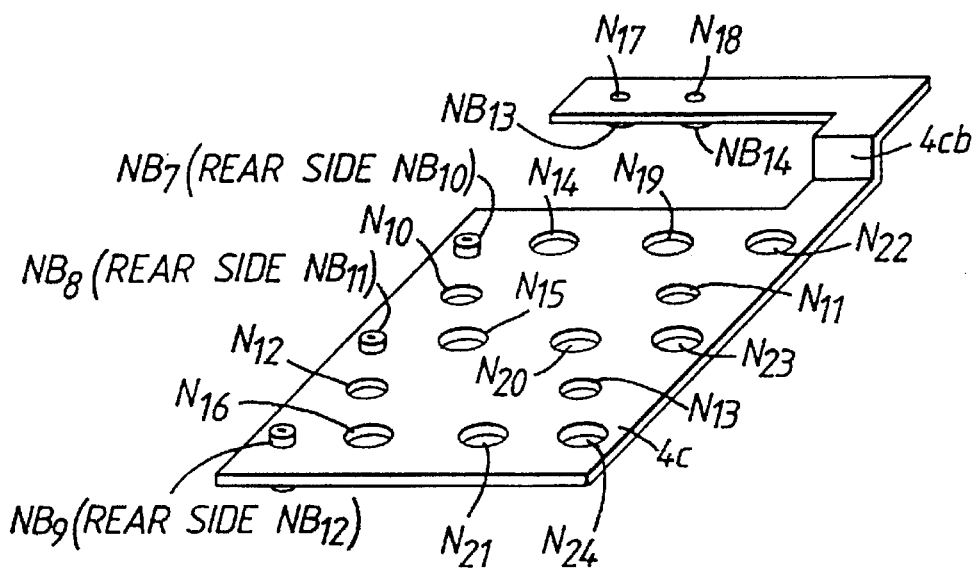

FIGS. 4 and 5 are parts of an exploded oblique view of batch laminated conductor 16, respectively, and the two parts together compose batch laminated conductor 16.

Batch laminated conductor 16 shown in FIGS. 4 and 5 is positioned on the rear side of heat receiving unit 6a, and is composed by the superimposition of a DC conductor 3c, a DC conductor 4c, an AC conductor 5c between them, and four insulating plates 20c, 21c, 22c and 23c which sandwich each of these conductors 3c, 4c and 5c. These are laminated in the sequence from the side which is in contact with each of terminals C and E of devices 1d–1f and 2d–2f of: insulating plate 23c, DC conductor 4c, insulating plate 22c, AC conductor 5c, insulating plate 21c, DC conductor 3c, insulating plate 20c.

In batch-laminated conductors 8 and 16, each of DC conductors 3b, 4b, 3c and 4c and AC conductors 5b and 5c is made of a copper plate (tin-plated, 2 mm thick), and each of insulating plates 20b, 21b, 22b, 23b, 20c, 21c, 22c and 23c is made of a PPS (polyphenylene sulfide) plate of 2 mm thickness.

As shown in FIGS. 2–5, L-shaped capacitor connecters 3bc, 3cb, 4bc and 4cb which connect with capacitors 15 are respectively attached to the leading edges of DC conductors 3b, 3c, 4b and 4c. Capacitor connectors 3cb and 4cb, which are positioned on the rear side, are bent toward the front surface of heat receiving unit 6a at the front of heat receiving unit 6a so that they can be connected to capacitor connectors 3bc and 4bc and to the positive and negative terminals of capacitors 15 on the front side of heat receiving unit 6. Also, a connector formed in a U-shape which is bent toward the front surface of heat receiving unit 6a at the front side of heat receiving unit 6a is provided on the leading edge of AC conductor 5c which is positioned on the rear side, so that it can be connected with AC conductor 5b. A gap is formed between each of DC conductors 3b, 3c, 4b and 4c and each of their capacitor connectors 3bc, 3cb, 4bc and 4cb by making each of capacitor connectors 3bc, 3cb, 4bc and 4cb L-shaped. Therefore, the connector of AC conductor 5c can be extended from the rear to the front. As a result, connection of AC conductor 5b and AC conductor 5c is made possible, through the U-shaped connector of AC conductor 5.

Figure 6A:
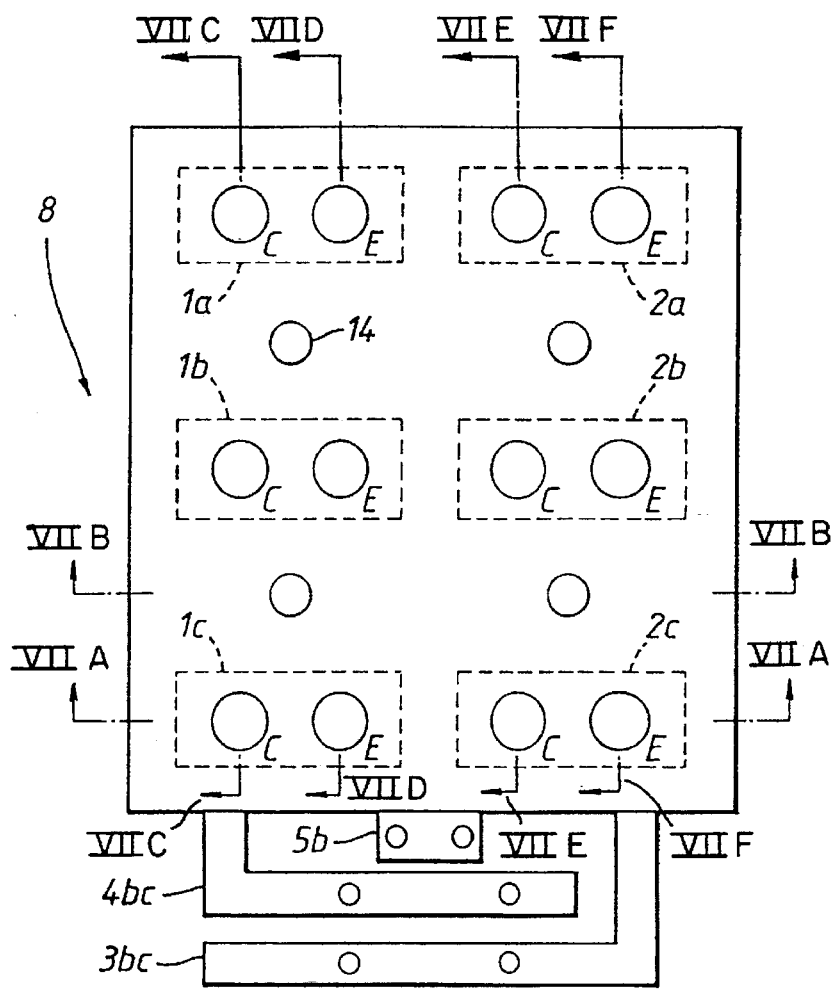
FIGS. 6(a) and 6(b) are respectively front and side elevations showing a front surface batch laminated conductor.
Figure 6B:
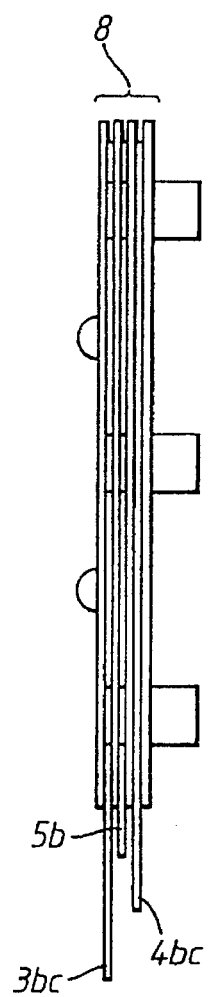

FIG. 6(a) is a plan of batch laminated conductor 8 seen from the front, that is from left side in FIG. 1(b). FIG. 6(b) is a right side elevation of this. FIGS. 7(a)–7(f) are cross-sectional views taken respectively on lines VIIA–VIIA to VIIF–VIIF in FIG. 6(a).

Figure 8A:
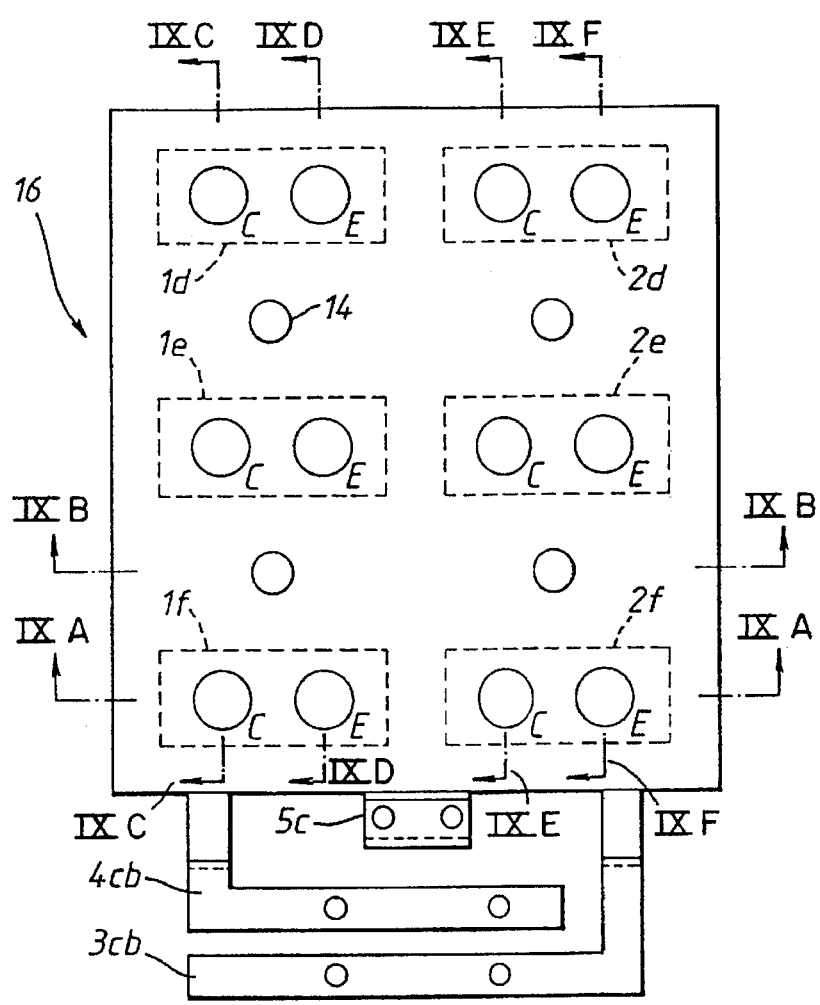
FIGS. 8(a) and 8(b) are respectively rear and side elevations showing a rear surface batch laminated conductor.
Figure 8B:
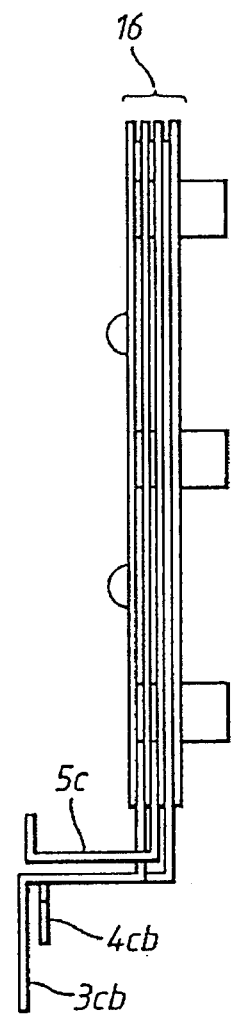

FIG. 8(a) is a plan of batch laminated conductor 16 seen from the front, that is from right side in FIG. 1(b). FIG. 8(b) is a side elevation of this. FIGS. 9(a)–9(f) are cross-sectional views taken respectively on lines IXA–IXA to IXF–IXF in FIG. 8(a).

The following is a description of batch laminated conductor 8. As shown in FIGS. 2 and 3, holes are opened in the insulating plates as follows: $I_1$–$I_{12}$ in insulating plate 20b; $I_{13}$–$I_{24}$ in insulating plate 21b; $I_{25}$–$I_{36}$ in insulating plate 22b and $I_{37}$–$I_{48}$ in insulating plate 23b. These holes $I_1$–$I_{48}$ are provided for thrusting through conductor collars (described later) which connect DC conductors 3b and 4b and AC conductor 5b with terminals C and E of devices 1a–1c and 2a–2c. Also further holes are opened in the insulating plates as follows: $I_A$–$I_D$ in insulating plate 20b; $I_E$–$I_H$ in insulating plate 21b; $I_I$–$I_L$ in insulating plate 22b and $I_M$–$I_P$ in insulating plate 23b. These holes $I_A$–$I_P$ are provided for insulated securing bolts 14 which secure the whole of batch laminated conductor 8 (See FIG. 6(a) and FIG. 7(b)).

Figure 7A:
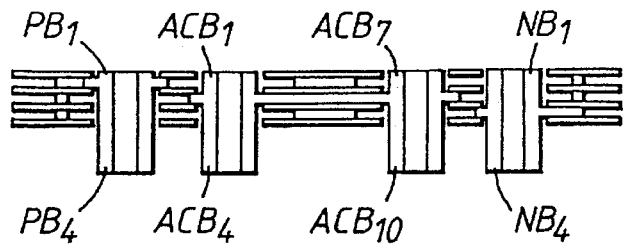
FIGS. 7(a)–7(f) are cross-sectional views taken respectively on lines VIIA–VIIA to VIIF–VIIF in FIG. 6(a) and showing the batch laminated conductor shown in FIG. 6(a)
Figure 7B:
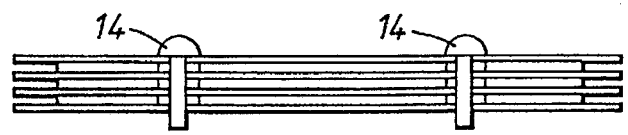
Figures 7C, 7D, 7E, 7F:
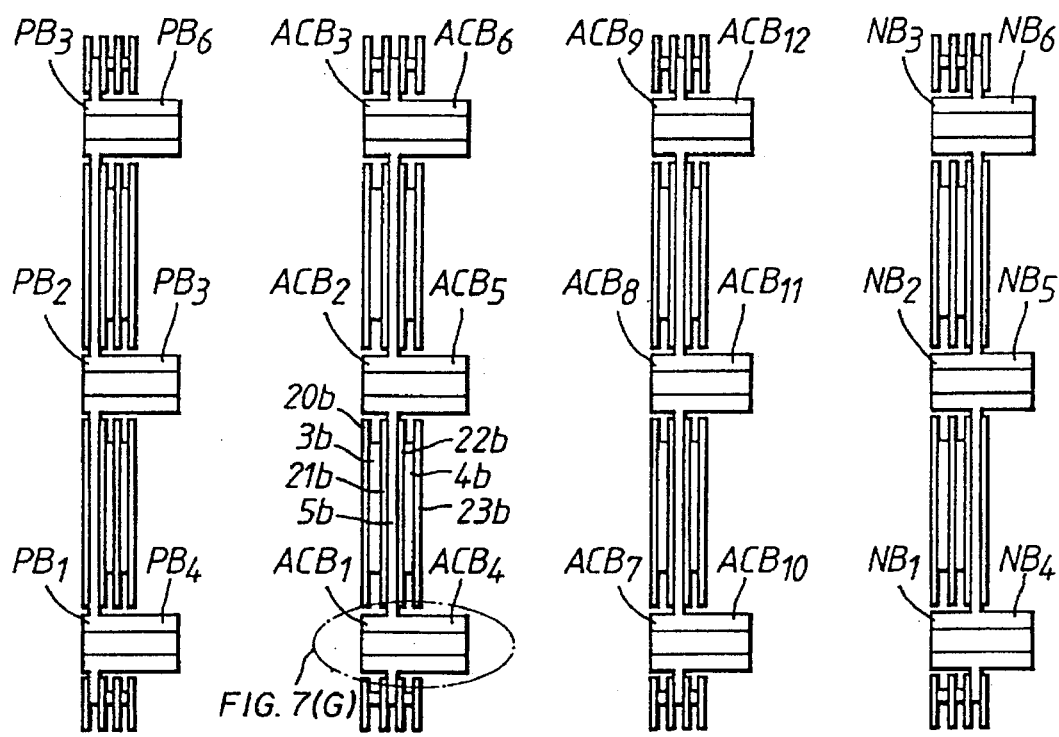
Figure 7G:
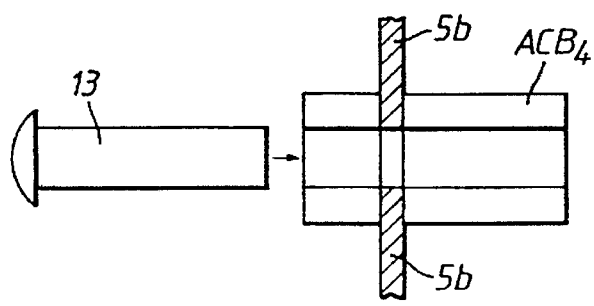

In FIG. 2, conductor collars $PB_1$–$PB_6$ are mounted on DC conductors 3b. Conductor collars $PB_1$ and $PB_4$, $PB_2$ and $PB_5$, $PB_3$ and $PB_6$ are respectively incorporated as one. Hollow space is provided in each of the centers of these for passing through a terminal connecting bolt 13. The conductor collars (described later) also have hollow spaces for passing through terminal connecting bolts 13. As shown in FIG. 7(c), positive terminal C of device 1c is electrically connected to DC conductor 3b by terminal connecting bolt 13 (not shown) which is thrust through conductor collars $PB_1$ and $PB_4$. Similarly, positive terminal C of device 1b is electrically connected to DC conductor 3b by terminal connecting bolt 13 (not shown) which is thrust through conductor collars $PB_2$ and $PB_5$. Positive terminal C of device 1a is electrically connected to DC conductor 3b by terminal connecting bolt 13 (not shown) which is thrust through conductor collars $PB_3$ and PB6. Also, holes $P_5$–$P_7$, holes $P_{25}$–$P_{27}$ and holes $P_{28}$–$P_{30}$ are opened in DC conductor 3b. These holes are respectively provided for thrusting through conductor collars $ACB_1$–$ACB_3$, conductor collars $ACB_7$–$ACB_9$ and conductor collars $NB_1$–$NB_3$ (described later). These holes are provided in sizes such that each of these conductor collars and DC conductor 3b do not make contact with each other so that these conductor collars are insulated from DC conductor 3b. Moreover, holes $P_1$–$P_4$ for insulated securing bolts 14 are opened in DC conductor 3b. Holes $P_8$ and $P_9$ are opened in capacitor connector 3bc of DC conductor 3b for conductor collars $PB_{13}$ and $PB_{14}$ (described later) which connect DC conductor 3b and DC conductor 3c and the positive terminals of capacitors 15.

In FIG. 3, conductor collars $NB_1$–$NB_6$ are mounted on DC conductor 4b. Conductor collars $NB_1$ and $NB_4$, $NB_2$ and $NB_5$, $NB_3$ and $NB_6$ are respectively incorporated as one. As shown in FIG. 7(f), negative terminal E of device 2c is electrically connected to DC conductor 4b by terminal connecting bolt 13 (not shown) which is thrust through conductor collars $NB_1$ and $NB_4$. Similarly, negative terminal E of device 2b is electrically connected to DC conductor 4b by terminal connecting bolt 13 (not shown) which is thrust through conductor collars $NB_2$ and $NB_5$. Negative terminal E of device 2a is electrically connected to DC conductor 4b by terminal connecting bolt 13 (not shown) which is thrust through conductor collars $NB_3$ and $NB_6$. Also, holes $N_5$–$N_7$, holes $N_{25}$–$N_{27}$ and holes $N_{28}$–$N_{30}$ are opened in DC conductor 4b. These holes are respectively provided for thrusting through conductor collars $ACB_{10}$–$ACB_{12}$, conductor collars $ACB_4$–$ACB_6$ and conductor collars $PB_4$–$PB_6$ (described above). These holes are provided in sizes such that each of these conductor collars and DC conductor 4b do not make contact with each other so that these conductor collars are insulated from DC conductor 4b. Moreover, holes $N_1$–$N_4$ for insulated securing bolts 14 are opened in DC conductor 4b. Holes $N_8$ and $N_9$ are opened in capacitor connector 4bc of DC conductor 4b for conductor collars $NB_{13}$ and $NB_{14}$ (described later) which connect DC conductor 4b and DC conductor 4c and the negative terminals of capacitors 15.

In FIG. 2, conductor collars $ACB_1$–$ACB_6$ and $ACB_1$–$ACB_{12}$ are mounted on AC conductor 5b. Conductor collars $ACB_1$ and $ACB_4$, $ACB_2$ and $ACB_5$, $ACB_3$ and $ACB_6$, $ACB_7$; and $ACB_{10}$, $ACB_8$ and $ACB_{11}$, $ACB_9$ and $ACB_{12}$ are respectively incorporated as one. As shown in FIG. 7(d) and (e), negative terminal E of device 1c is electrically connected to AC conductor 5b by terminal connecting bolt 13 (not shown) which is thrust through conductor collars $ACB_1$ and $ACB_4$. Similarly, negative terminal E of device 1b is electrically connected to AC conductor 5b by terminal connecting bolt 13 (not shown) which is thrust through conductor collars $ACB_2$ and $ACB_5$. Negative terminal E of device 1a is electrically connected to AC conductor 5b by terminal connecting bolt 13 (not shown) which is thrust through conductor collars $ACB_3$ and $ACB_6$. Similarly, positive terminal C of device 2c, positive terminal C of device 2b and positive terminal C of device 2a are connected to AC conductor 5b by terminal connecting bolts 13 (not shown) which are respectively thrust through conductor collars $ACB_7$ and $ACB_{10}$, conductor collars $ACB_8$ and $ACBA_{11}$, and conductor collars $ACB_9$ and $ACB_{12}$. Also, holes $AC_{19}$–$AC_{21}$ and holes $AC_{22}$–$AC_{24}$ are opened in AC conductor 5b. Also, holes are respectively provided for thrusting through conductor collars $NB_1$–$NB_3$, and conductor collars $PB_4$–$PB_6$. These holes are provided in sizes such that each of these conductor collars and DC conductor 5b do not make contact with each other so that these conductor collars are insulated from AC conductor 5b. Moreover, holes $AC_1$–$AC_4$ for insulated securing bolts 14 are opened in AC conductor 5b, and holes $AC_5$ and $AC_6$ for connecting bolts 17 (see FIG. 1(b)), which electrically connect AC conductor 5b to AC conductor 5c, are opened in AC conductor 5b.

The following is a description of batch laminated conductor 16. As shown in FIGS. 4 and 5, holes are opened in the insulating plates as follows: $I_{49}$–$I_{60}$ in insulating plate $20c$; $I_{61}$–$I_{72}$ in insulating plate $21c$; $I_{73}$–$I_{84}$ in insulating plate $22c$ and $I_{85}$–$I_{96}$ in insulating plate $23c$. These holes $I_{49}$–$I_{96}$ are provided for thrusting through conductor collars (described later) which connect DC conductors $3c$ and $4c$ and AC conductor $5c$ with terminals C and E of devices $1d$–$1f$ and $2d$–$2f$. Also, further holes are opened in the insulating plates as follows: $I_Q$–$I_T$ in insulating plate $20c$; $I_U$–$I_X$ in insulating plate $21c$; $I_Y$–$I_Z$, $I_{AA}$ and $I_{AB}$ in insulating plate $22c$ and $I_{AC}$, $I_{AD}$, $I_{AE}$ and $I_{AF}$ in insulating plate $23c$. These holes $I_Q$–$I_{AF}$ are provided for insulated securing bolts 14 which secure the whole of batch laminated conductor 16 (See FIG. 8(a) and FIG. 9(b)).

Figure 9A:
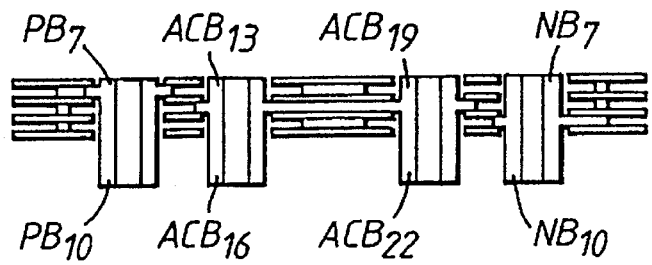
FIGS. 9(a)–9(f) are cross-sectional views taken respectively on lines IXA–IXA to IXF–IXF in FIG. 8(a) showing the batch laminated conductor FIG. 8(a)
Figure 9B:
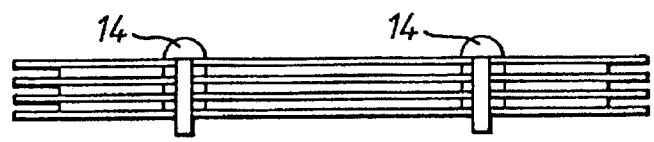
Figures 9C, 9D, 9E, 9F:
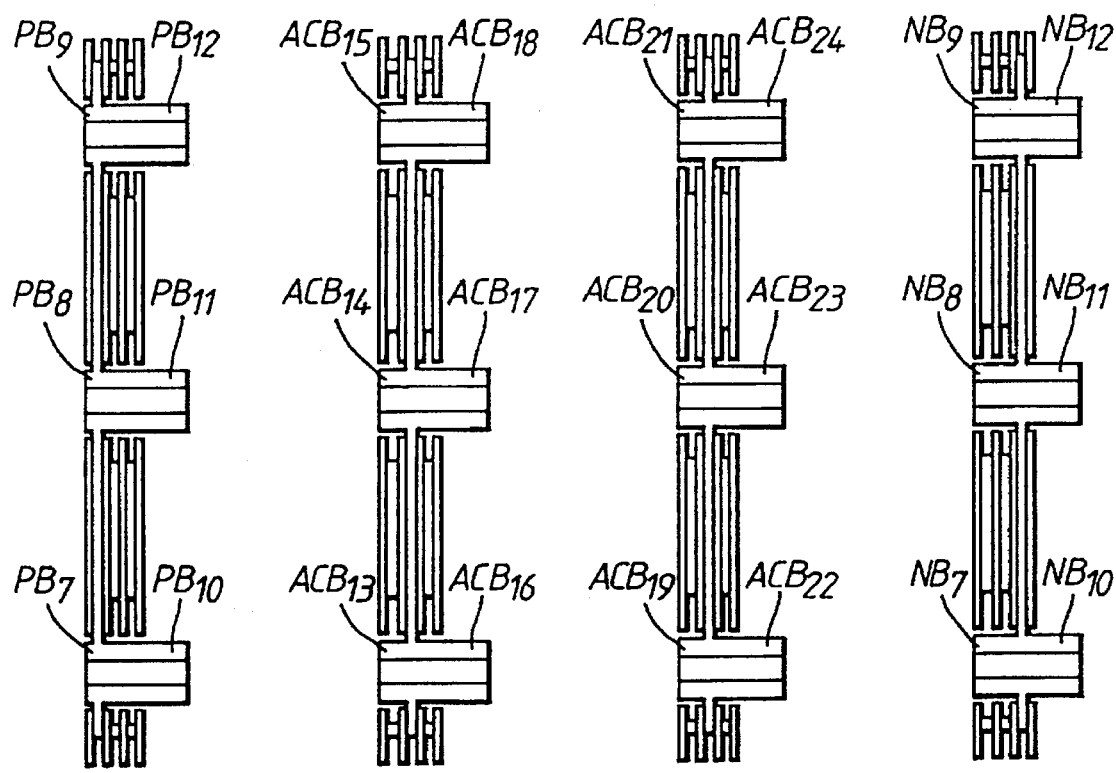
Figure 10:
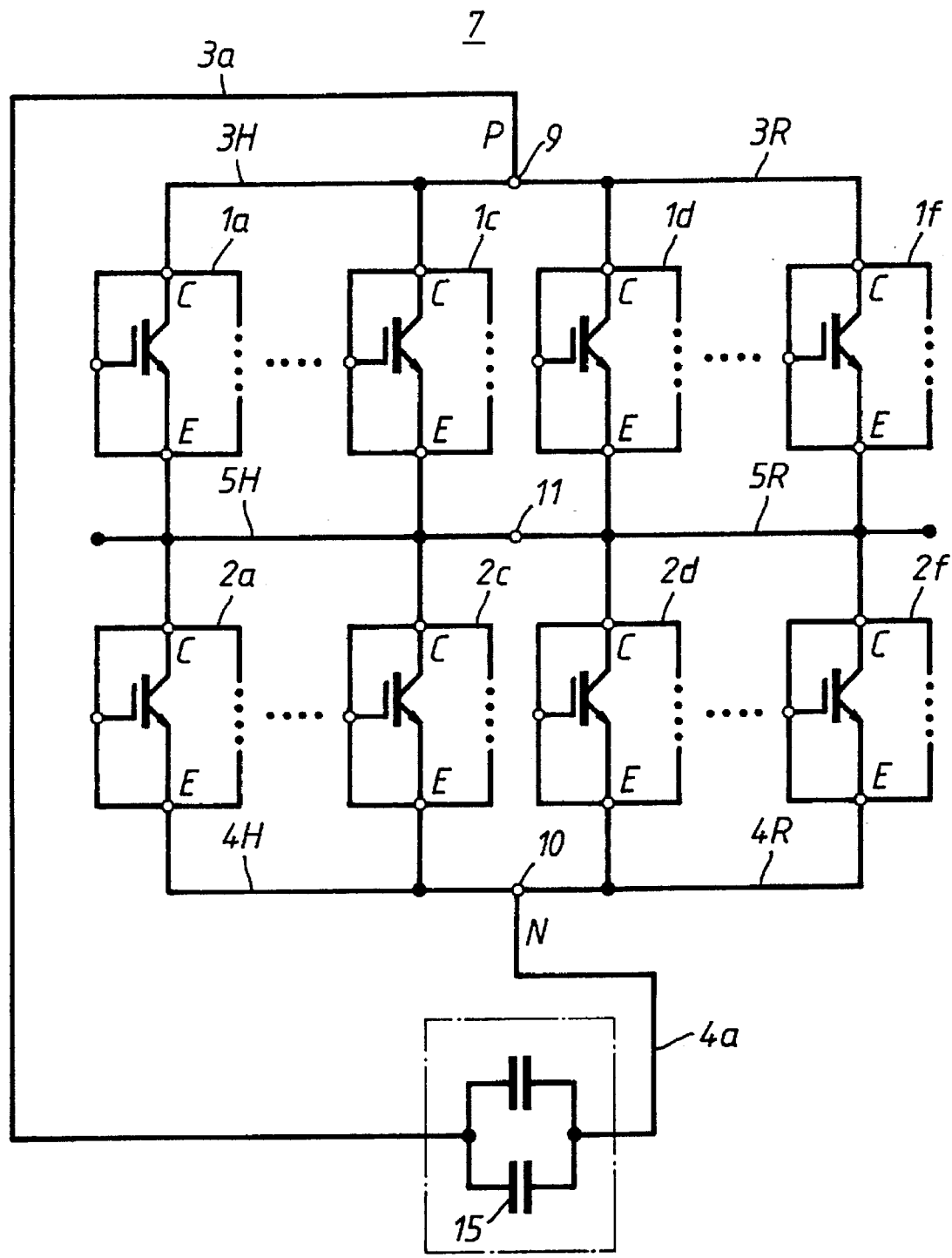
FIG. 10 is a circuit diagram of the switching devices and capacitor incorporated in a semiconductor stack.

In FIG. 4, conductor collars $PB_7$–$PB_{12}$ are mounted on DC conductor $3c$. Conductor collars $PB_7$ and $PB_{10}$, $PB_8$ and $PB_{11}$, $PB_9$ and $PB_{12}$ are respectively incorporated as one. As shown in FIG. 9(c), positive terminal C of device $1f$ is electrically connected to DC conductor $3c$ by terminal connecting bolt 13 (not shown) which is thrust through conductor collars $PB_7$ and $PB_{10}$. Similarly, positive terminal C of device $1e$ is electrically connected to DC conductor $3c$ by terminal connecting bolt 13 (not shown) which is thrust through conductor collars $PB_8$ and $PB_{11}$. Positive terminal C of device $1d$ is electrically connected to DC conductor $3c$ by terminal connecting bolt 13 (not shown) which is thrust through conductor collars $PB_9$ and $PB_{12}$. Also, holes $P_{14}$–$P_{16}$, holes $P_{19}$–$P_{21}$ and holes $P_{22}$–$P_{24}$ are opened in DC conductor $3c$. These holes are respectively provided for thrusting through conductor collars $ACB_{13}$–$ACB_{15}$, conductor collars $ACB_{19}$–$ACB_{21}$ and conductor collars $NB_7$–$NB_9$ (described later). These holes are provided in sizes such that each of these conductor collars and DC conductor $3c$ do not make contact with each other so that these conductor collars are insulated from DC conductor $3c$. Moreover, holes $P_{10}$–$P_{13}$ for insulated securing bolts 14 are opened in DC conductor $3c$. Holes $P_{17}$ and $P_{18}$ are opened in capacitor connector $3cb$ of DC conductor $3c$ for conductor collars $PB_{13}$ and $P_{14}$, which connect DC conductor $3b$ and DC conductor $3c$ and the positive terminals of capacitors 15.

In FIG. 5, conductor collars $NB_7$–$NB_{12}$ are mounted on DC conductor $4c$. Conductor collars $NB_7$ and $NB_{10}$, $NB_8$ and $NB_{11}$, $NB_9$ and $NB_{12}$ are respectively incorporated as one. As shown in FIG. 9(f), negative terminal E of device $2f$ is electrically connected to DC conductor $4c$ by terminal connecting bolt 13 (not shown) which is thrust through conductor collars $NB_7$ and $NB_{10}$. Similarly, negative terminal E of device $2e$ is electrically connected to DC conductor $4c$ by terminal connecting bolt 13 (not shown) which is thrust through conductor collars $NB_8$ and $NB_{11}$. Negative terminal E of device $2d$ is electrically connected to DC conductor $4c$ by terminal connecting bolt 13 (not shown) which is thrust through conductor collars $NB_9$ and $NB_{12}$. Also, holes $N_{14}$–$N_{16}$, holes $N_{19}$–$N_{21}$ and holes $N_{22}$–$N_{24}$ are opened in DC conductor $4c$. These holes are respectively provided for thrusting through conductor collars $ACB_{19}$–$ACB_{21}$, conductor collars $ACB_{13}$–$ACB_{15}$ (described later) and conductor collars $PB_{10}$–$PB_{12}$ (described above). These holes are provided in sizes such that each of these conductor collars and DC conductor $4c$ do not make contact with each other so that these conductor collars are insulated from DC conductor $4c$. Moreover, holes $N_{10}$–$N_{13}$ for insulated securing bolts 14 are opened in DC conductor $4b$. Holes $N_{17}$ and $N_{18}$ are opened in capacitor connector $4cb$ of DC conductor $4c$ for conductor collars $NB_{13}$ and $NB_{14}$, which connect DC conductor $4b$ and DC conductor $4c$ and the negative terminals of capacitors 15. In FIG. 4, conductor collars $ACB_{19}$–$ACB_{24}$ and $ACB_{13}$–$ACB_{18}$ are mounted on AC conductor $5c$. Conductor collars $ACB_{19}$ and $ACB_{22}$, $ACB_{20}$ and $ACB_{23}$, $ACB_{21}$ and $ACB_{24}$, $ACB_{13}$ and $ACB_{16}$, $ACB_{14}$ and $ACB_{17}$, $ACB_{15}$ and $ACB_{18}$ are respectively incorporated as one. As shown in FIG. 9(d) and (e), negative terminal E of device $1f$ is electrically connected to AC conductor $5c$ by terminal connecting bolt 13 (not shown) which is thrust through conductor collars $ACB_{13}$ and $ACB_{16}$. Similarly, negative terminal E of device $1e$ is electrically connected to AC conductor $5c$ by terminal connecting bolt 13 (not shown) which is thrust through conductor collars $ACB_{14}$ and $ACB_{17}$. Negative terminal E of device $1d$ is electrically connected to AC conductor $5c$ by terminal connecting bolt 13 (not shown) which is thrust through conductor collars $ACB_{15}$ and $ACB_{18}$. Similarly, positive terminal C of device $2f$, positive terminal C of device $2e$ and positive terminal C of device $2d$ are connected to AC conductor $5c$ by terminal connecting bolts 13 (not shown) which are respectively thrust through conductor collars $ACB_{19}$ and $ACB_{22}$, conductor collars $ACB_{20}$ and $ACB_{23}$, and conductor collars $ACB_{21}$ and $ACB_{24}$. Also, holes $AC_{11}$–$AC_{13}$ and holes $AC_{14}$–$AC_{16}$ are opened in AC conductor $5c$. These holes are respectively provided for thrusting through conductor collars $NB_7$–$NB_9$, and conductor collars $PB_{10}$–$PB_{12}$ (described above). These holes are provided in sizes such that each of these conductor collars and DC conductor $5c$ do not make contact with each other so that these conductor collars are insulated from AC conductor $5c$. Moreover, holes $AC_1$–$AC_4$ for insulated securing bolts 14 are opened in AC conductor $5c$, and holes $AC_{17}$ and $AC_{18}$ for connecting bolts 17, which electrically connect AC conductor $5c$ to AC conductor $5b$, are opened in AC conductor $5c$.

In this way, DC conductors and an AC conductor and insulators are incorporated as a batch laminated conductor which are arranged on the switching devices. By this means, the connecting distance between conductors can be shortened without dividing the connections between the terminals of the devices and the capacitor into two. Therefore, the wiring reactance can be made smaller, about one half of that in stack 7 shown in FIGS. 11(a) and 11(b), and surge voltages during switching operations can be suppressed. The balance of currents flowing through each of devices connected in parallel is improved, because the DC and AC conductors are plate-shaped so the actual resistances between each of the devices and the DC or AC terminal become approximately equal. Furthermore, since the conductors are incorporated as a batch laminated conductor, labour time for connecting the conductors can be shortened.

In the embodiment, a batch laminated conductor is composed by the superimposition of DC conductors $3b$ and $3c$, DC conductors $4b$ and $4c$, AC conductors $5b$ and $5c$ and multiple insulators. However, a laminated composition in which each conductor surface is coated with an insulating agent without using separate insulating sheets may also be used. Moreover, in the embodiment, switching devices which have a positive terminal and a negative terminal each are used in pairs on the front surface and the rear surface. Therefore a composition in which a total of four terminals are led to the outside has been described. However, a batch laminated conductor having a similar composition to that of the embodiment can be used for two-in one type switching devices each having a common connecting terminal apart from a positive terminal and a negative terminal, that is a total of three terminals, are led out.

When using this invention, a semiconductor stack can be achieved which is capable of making the circuit wiring reactance smaller and further suppressing surge voltages during the switching operation of each device. Furthermore, a semiconductor stack can be achieved which can improve the balance of currents flowing through the devices.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor stack, comprising:

a base member; and a semiconductor assembly member provided on said base member;

said semiconductor assembly member including, a switching element having a first terminal, a second terminal and a third terminal, mounted on a surface of said base member such that said first, second and third terminals of said switching element are led to a common plane, a batch laminated conductor positioned on said first, second and third terminals of said switching element, composed of superimposition of a first conductor, a second conductor, a third conductor and insulators for insulating between adjacent two of said conductors, first connecting means for connecting said first conductor and said first terminal of said switching element, said first connecting means extending through said batch laminated conductor in a state in which said first connecting means is electrically connected to said first conductor and is insulated from said second and third conductors, second connecting means for connecting said second conductor and said second terminal of said switching element, said second connecting means extending through said batch laminated conductor in a state in which said second connecting means is electrically connected to said second conductor and is insulated from said first and third conductors, and third connecting means for connecting said third conductor and said third terminal of said switching element, said third connecting means extending through said batch laminated conductor in a state in which said third connecting means is electrically connected to said third conductor and is insulated from said first and second conductors.

2. A semiconductor stack, comprising:

a base member;

a first semiconductor assembly member provided on a first surface of said base member;

a second semiconductor assembly member provided on a second surface of said base member;

each of said first and second semiconductor assembly members including, a switching element having a first terminal, a second terminal and a third terminal, mounted on one of said first and second surfaces of said base member such that said first, second and third terminals of said switching element are led to a common plane, a batch laminated conductor positioned on said first, second and third terminals of said switching element, composed of superimposition of a first conductor, a second conductor, a third conductor and insulators for insulating between adjacent two of said conductors, said batch laminated conductor including a first connection portion electrically connected to said first conductor, a second connection portion electrically connected to said second conductor and a third connection portion electrically connected to said third conductor, first connecting means for connecting said first conductor and said first terminal of said switching element, said first connecting means extending through said batch laminated conductor in a state in which said first connecting means is electrically connected to said first conductor and is insulated from said second and third conductors, second connecting means for connecting said second conductor and said second terminal of said switching element, said second connecting means extending through said batch laminated conductor in a state in which said second connecting means is electrically connected to said second conductor and is insulated from said first and third conductors, and third connecting means for connecting said third conductor and said third terminal of said switching element, said third connecting means extending through said batch laminated conductor in a state in which said third connecting means is electrically connected to said third conductor and is insulated from said first and second conductors;

first conductor connecting means for connecting said first connection portion of said first semiconductor assembly member and said first connection portion of said second semiconductor assembly member;

second conductor connecting means for connecting said second connection portion of said first semiconductor assembly member and said second connection portion of said second semiconductor assembly member; and third conductor connecting means for connecting said third connection portion of said first semiconductor assembly member and said third connection portion of said second semiconductor assembly member.

3. The semiconductor stack according to claim 2, further comprising a capacitor, wherein:

said first conductor connecting means includes a first capacitor connection portion connected to a first terminal of said capacitor; and said third conductor connecting means includes a second capacitor connection portion connected to a second terminal of said capacitor.

4. The semiconductor stack according to claim 2, wherein:

said base member is composed of a heat receiving unit of a heat sink for radiating heat generated by said switching element.

5. The semiconductor stack according to claim 2, wherein in said batch laminated conductor:

each of said first, second and third conductors is plate-shaped; and each of said insulators is plate-shaped.

6. The semiconductor stack according to claim 2, wherein in said batch laminated conductor:

each of said first, second and third conductors is plate-shaped and coated with an insulating agent; and each of said insulators is made of at least one of insulating coating layers formed on surfaces of one of said first, second and third conductors.

7. The semiconductor stack according to claim 2, wherein:

said switching element is composed of a positive switching device and a negative switching device connected in series;

said first terminal of said switching element includes a positive terminal of said positive switching device;

said second terminal of said switching element includes a negative terminal of said positive switching device and a positive terminal of said negative switching device; and said third terminal of said switching element includes a negative terminal of said negative switching device.

8. The semiconductor stack according to claim 2, wherein:

said switching element is composed of a plurality of parallel circuits of a positive switching device and a negative switching device connected in series;

said first terminal of said switching element includes positive terminals of said plurality of said positive switching devices;

said second terminal of said switching element includes negative terminals of said plurality of said positive switching devices and positive terminals of said plurality of said negative switching devices; and said third terminal of said switching element includes negative terminals of said plurality of said negative switching devices.

9. The semiconductor stack according to claim 2, wherein:

said switching element is composed of a two-in-one type switching device;

said two-in-one type switching device being composed of a positive switching device and a negative switching device connected in series and having a positive terminal connected to a positive terminal of said positive switching device, a common terminal connected to a negative terminal of said positive switching device and a positive terminal of said negative switching device commonly, and a negative terminal connected to a negative terminal of said negative switching device;

said first terminal of said switching element includes said positive terminal of said two-in-one type switching device;

said second terminal of said switching element includes said common terminal of said two-in-one type switching device; and said third terminal of said switching element includes said negative terminal of said two-in-one type switching device.

10. The semiconductor stack according to claim 2, wherein:

said switching element is composed of a plurality of two-in-one type switching devices connected in parallel;

said two-in-one type switching device being composed of a positive switching device and a negative switching device connected in series and having a positive terminal connected to a positive terminal of said positive switching device, a common terminal connected to a negative terminal of said positive switching device and a positive terminal of said negative switching device commonly, and a negative terminal connected to a negative terminal of said negative switching device;

said first terminal of said switching element includes said positive terminals of said plurality of said two-in-one type switching devices;

said second terminal of said switching element includes said common terminals of said plurality of said two-in-one type switching devices; and said third terminal of said switching element includes said negative terminals of said plurality of said two-in-one type switching devices.

11. A semiconductor stack, comprising:

a base member having a mounting surface; and a semiconductor assembly member mounted on said base member;

said semiconductor assembly member including, a switching element having a first terminal, a second terminal and a third terminal, the switching element being mounted on the mounting surface of said base member such that said first, second and third terminals of said switching element extend to a common plane, a laminated conductor positioned on said first, second and third terminals of said switching element, the laminated conductor comprising a first conductor layer, a second conductor layer, a third conductor layer and an insulating layer between each adjacent two of said conductor layers, first connecting means for connecting said first conductor layer and said first terminal of said switching element, said first connecting means extending through said laminated conductor in a state in which said first connecting means is electrically connected to said first conductor layer and is insulated from said second and third conductor layers, second connecting means for connecting said second conductor layer and said second terminal of said switching element, said second connecting means extending through said laminated conductor in a state in which said second connecting means is electrically connected to said second conductor layer and is insulated from said first and third conductor layers, and third connecting means for connecting said third conductor layer and said third terminal of said switching element, said third connecting means extending through said laminated conductor in a state in which said third connecting means is electrically connected to said third conductor layer and is insulated from said first and second conductor layers.

12. A semiconductor stack, comprising:

a base member having opposite first and second mounting surfaces;

a first semiconductor assembly member mounted on the first surface of said base member;

a second semiconductor assembly member mounted on the second surface of said base member;

each of said first and second semiconductor assembly members including, a switching element having a first terminal, a second terminal and a third terminal, the switching element being mounted on one of said first and second mounting surfaces of said base member such that said first, second and third terminals of said switching element extend to a common plane, a laminated conductor positioned on said first, second and third terminals of said switching element, the laminated conductor comprising a first conductor layer, a second conductor layer, a third conductor layer and an insulating layer between each adjacent two of said conductor layers, said laminated conductor including a first connection portion electrically connected to said first conductor layer, a second connection portion electrically connected to said second conductor layer and a third connection portion electrically connected to said third conductor layer, first connecting means for connecting said first conductor layer and said first terminal of said switching element, said first connecting means extending through said laminated conductor in a state in which said first connecting means is electrically connected to said first conductor layer and is insulated from said second and third conductor layers, second connecting means for connecting said second conductor layer and said second terminal of said switching element, said second connecting means extending through said laminated conductor in a state in which said second connecting means is electrically connected to said second conductor layer and is insulated from said first and third conductor layers, and third connecting means for connecting said third conductor layer and said third terminal of said switching element, said third connecting means extending through said laminated conductor in a state in which said third connecting means is electrically connected to said third conductor layer and is insulated from said first and second conductor layers;

first conductor connecting means for connecting said first connection portion of said first semiconductor assembly member and said first connection portion of said second semiconductor assembly member;

second conductor connecting means for connecting said second connection portion of said first semiconductor assembly member and said second connection portion of said second semiconductor assembly member; and third conductor connecting means for connecting said third connection portion of said first semiconductor assembly member and said third connection portion of said second semiconductor assembly member.

* * * * *